(12) United States Patent
Rao et al.

(10) Patent No.: US 7,816,211 B2
(45) Date of Patent: Oct. 19, 2010

(54) METHOD OF MAKING A SEMICONDUCTOR DEVICE HAVING HIGH VOLTAGE TRANSISTORS, NON-VOLATILE MEMORY TRANSISTORS, AND LOGIC TRANSISTORS

(75) Inventors: Rajesh A. Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 602 days.

(21) Appl. No.: 11/627,725

(22) Filed: Jan. 26, 2007

(65) Prior Publication Data

US 2008/0179658 A1    Jul. 31, 2008

(51) Int. Cl.
*H01L 21/8234* (2006.01)
*H01L 21/336* (2006.01)
(52) U.S. Cl. .................. 438/275; 438/257; 438/258; 257/E21.625; 257/E21.689
(58) Field of Classification Search .................. 438/258, 438/257, 275; 257/E21.689, E21.625
See application file for complete search history.

(56) References Cited

U.S. PATENT DOCUMENTS

| | | | |
|---|---|---|---|
| 6,958,265 B2 | 10/2005 | Steimle et al. | |
| 7,091,089 B2 | 8/2006 | Steimle | |
| 7,176,094 B2* | 2/2007 | Zhong et al. | 438/287 |
| 2003/0080436 A1* | 5/2003 | Ishikawa | 257/776 |
| 2003/0170956 A1 | 9/2003 | Zhong et al. | |
| 2005/0059213 A1 | 3/2005 | Steimle et al. | |
| 2005/0287729 A1 | 12/2005 | Steimle | |
| 2006/0160311 A1* | 7/2006 | Rao et al. | 438/275 |
| 2006/0194438 A1 | 8/2006 | Rao et al. | |

FOREIGN PATENT DOCUMENTS

KR    1020060057958 A    5/2006

OTHER PUBLICATIONS

PCT Search report and Written Opinion for corresponding PCT Application No. PCT/US08/50697 mailed May 22, 2008.

* cited by examiner

*Primary Examiner*—Shouxiang Hu
(74) *Attorney, Agent, or Firm*—James L. Clingan, Jr.

(57) ABSTRACT

A semiconductor device is made on a semiconductor substrate. A first insulating layer is formed on the semiconductor substrate for use as a gate dielectric for a high voltage transistor in a first region of the semiconductor substrate. After the first insulating layer is formed, a second insulating layer is formed on the semiconductor substrate for use as a gate dielectric for a non-volatile memory transistor in a second region of the substrate. After the second insulating layer is formed, a third insulating layer is formed on the semiconductor substrate for use as a gate dielectric for a logic transistor in a third region of the substrate.

5 Claims, 6 Drawing Sheets

METHOD OF MAKING A SEMICONDUCTOR DEVICE HAVING HIGH VOLTAGE TRANSISTORS, NON-VOLATILE MEMORY TRANSISTORS, AND LOGIC TRANSISTORS

BACKGROUND

The present invention relates generally to methods of forming semiconductor devices, and more particularly to semiconductor processes for forming nanoclusters or silicon dots.

DESCRIPTION OF THE RELATED ART

When silicon dots, which are commonly called nanoclusters or nanocrystals, are formed in a non-volatile memory (NVM) of an integrated circuit, the nanocrystals that are deposited need to be preserved during subsequent processing. Typically, further processing required for various transistor types creates difficulties with preserving the nanocrystals. It is not unusual to have three different gate dielectric thicknesses for transistors of different purposes. The thinnest gate dielectrics are for the logic transistors that are normally for the fastest speeds. Another thickness is for the transistors used as the inputs and outputs of voltage signals to and from the integrated circuit. The largest thickness is for the high voltage transistors that are used for the highest voltages in the particular integrated circuit such as for programming and erasing the NVM transistors. The extra processing for one or more of these transistor types, especially the high voltage transistors, often includes exposure to highly oxidizing ambients that can degrade or consume the nanocrystals. This can also cause an increase in oxide growth from the substrate which increases the gate dielectric thickness. This increased thickness in gate dielectric is uneven because of the presence of the nanocrystals.

On the other hand a difficulty with making the regular (non-NVM) transistor gate dielectrics first is that these gate dielectrics are then subjected to etches during the formation of the gate dielectrics of the NVM devices. These etches adversely affect the gate dielectrics and result in reduced transistor performance. Thus the typical approach has been to form the NVM gate dielectrics followed by the regular transistor gate dielectrics.

Accordingly there is a need for a process that improves on one or more of the above described problems.

BRIEF DESCRIPTION OF THE DRAWINGS

The present invention is illustrated by way of example and not limitation in the accompanying figures, in which like references indicate similar elements, and in which.

DETAILED DESCRIPTION OF THE PREFERRED EMBODIMENT(S)

In one aspect, a semiconductor device has at least three different types of transistors one of which is an NVM transistor that uses nanocrystals for charge storage. One of the transistor types is a high voltage transistor that has a relatively thick gate dielectric. This thick gate dielectric has a very thin nitrogen-rich oxide layer, preferably formed using decoupled plasma nitridation, that is sufficiently uniform to cover the thick gate dielectric. This nitrogen-rich oxide layer has minimal impact on the electrical characteristics of the gate dielectric because it is very thin but provides a good etch stop because it has substantially the etch characteristics of nitride and is uniform. Also because it is nitrogen-rich oxide it suffers minimal damage during subsequent formation of the gate dielectric of the NVM transistor. A gate dielectric, thinner than the gate dielectric of the high voltage transistor, of a regular transistor is formed after the gate dielectric of the NVM transistor. This thinner gate dielectric causes less problem with degradation of the nanocrystals than would the process for forming the gate dielectric of the high voltage transistor. This is better understood with reference to the drawings and the following description.

Figure 1:
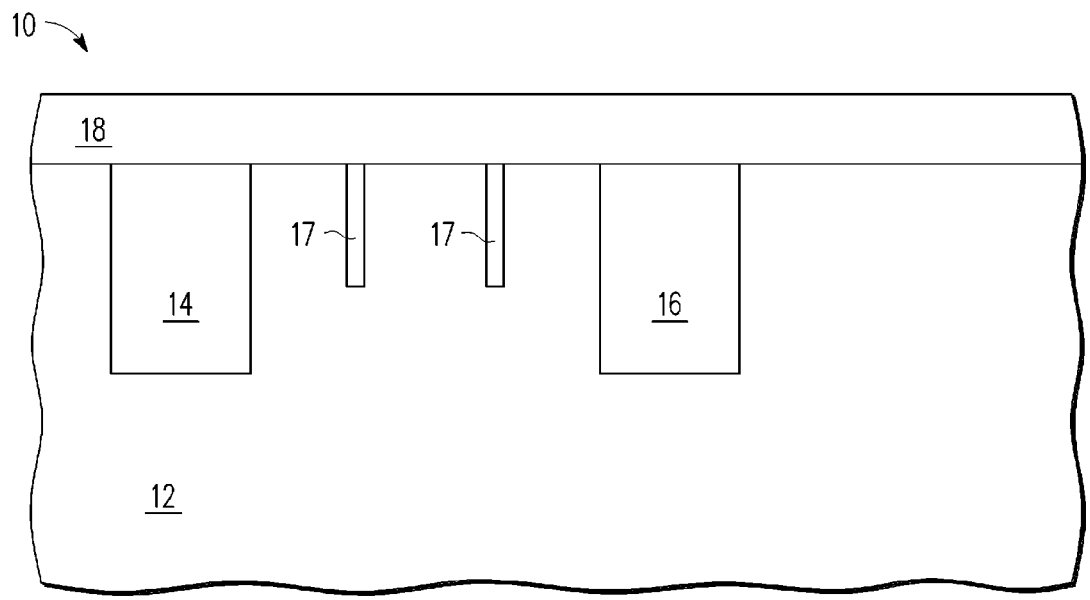
FIG. 1 is a cross section of a semiconductor device according to an embodiment of the invention.

Shown in FIG. 1 is a semiconductor device 10 comprising a semiconductor substrate 12, an oxide layer 18 on substrate 12, a region 14 in substrate 12, a region 16 in substrate 12, and an isolation region 17 surrounding a portion of substrate 12. Substrate 12 is preferably silicon but could be another semiconductor material or combination of materials such as silicon germanium (SiGe). Region 14 is a well region for forming high voltage transistors. Region 16 is a well region for forming transistors used in providing inputs and outputs (I/O transistors) of semiconductor device 10. Oxide layer 18 is the principal portion of a gate dielectric for high voltage transistors formed in region 14. Oxide is a preferred material for gate dielectrics but another gate dielectric material that has high selectivity to an etch chemistry that is used to etch oxide and nanocrystals can be used. Region 14 is preferably doped for optimizing the high voltage transistors. Similarly Region 16 is doped for optimizing the I/O transistors. Isolation region 17 is of an oxide trench penetrating into substrate 12. The portion of substrate 12 surrounded by isolation region 17 is for forming non-volatile memory (NVM) transistors. Oxide layer 18 is preferably about 150 Angstroms thick. The thickness chosen is related to how high the voltage is that will be used by the high voltage transistors. Regions 14 and 16 are preferably about 3 to 5 thousand Angstroms deep. This depth may vary even further. Isolation 17 is about 2 to 4 thousand Angstroms in depth. Typically the isolation need not be as deep as the well, but there may be instances where isolation is as deep as the well. The lateral dimension of regions 14 and 16 and the distance across region 17 can vary greatly depending upon the number of transistors and the sizes of those transistors that are to be formed in those locations. A well may contain an entire memory array or just one transistor. Although not shown, regions 14 and 16 preferably have isolation regions similar to isolation 17 surrounding them.

Figure 2:
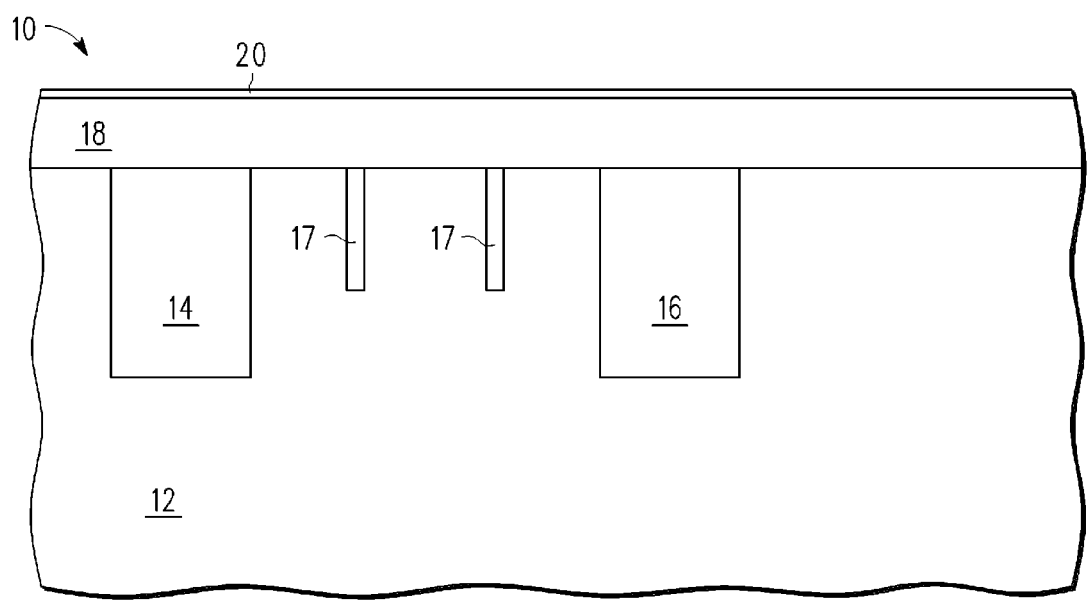
FIG. 2 is a cross section of the semiconductor device of FIG. 1 after subsequent processing.

Shown in FIG. 2 is semiconductor device 10 after performing decoupled plasma nitridation (DPN) on oxide layer 18 to form a nitrogen-rich oxide layer 20 on oxide layer 18. This nitrogen-rich oxide layer is preferably very thin, no more than 10 Angstroms, be sufficiently uniform to completely cover oxide layer 18, and have a nitrogen concentration not more than 10 atomic percent. DPN is capable of achieving this uniformity while achieving a thickness less than 10 Angstroms. Further typical nitride deposition processes are not capable of forming such a thin layer or of having the desired low concentration of nitrogen. Even atomic layer deposition (ALD) has been found to not be uniform for nitride until about 5 layers or more are deposited, which is much more than 10 Angstroms, or be able to achieve the desired low concentration of nitrogen. With DPN, even 5 Angstroms may be achievable. Alternately remote plasma nitridation may also be effective to form nitrogen-rich oxide layer 20. Nitrogen-rich oxide layer 20, although not stoichiometric silicon nitride, has many of the characteristics of nitride. In particular, it has high selectivity to certain etchants that are used for etching oxide. For example, hydrofluoric acid etches oxide very much faster than nitrogen-rich oxide such as layer 20. While it is desirable to have sufficient nitrogen concentration to achieve this desired etch characteristic, it is also desirable to have a low nitrogen concentration, less than 10 atomic percent, to more closely preserve the electrical characteristics of oxide. An effective DPN process or achieving this balance is to expose the wafer to a remote nitrogen plasma with plasma power between 200 W and 600 W, nitrogen partial pressure between 1 mTorr and 50 mTorr and wafer temperature between 25 C and 300 C.

Figure 3:
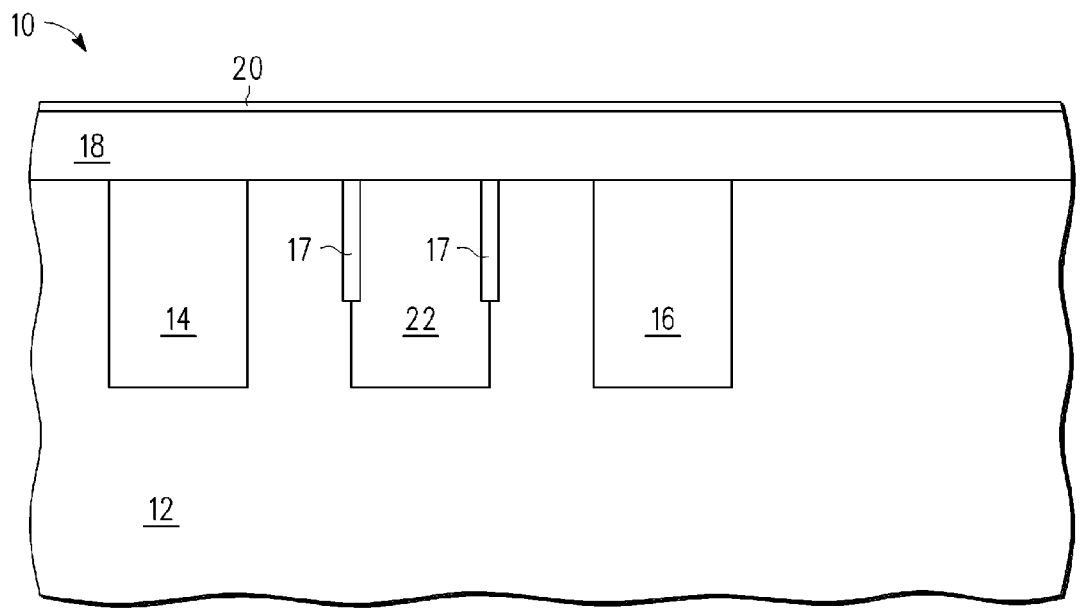
FIG. 3 is a cross section of the semiconductor device of FIG. 2 after subsequent processing.

Shown in FIG. 3 is semiconductor device 10 after performing a patterned implant inside isolation 17. The result is a region 22 that is a well that is doped for the purpose of forming NVM transistors.

Figure 4:
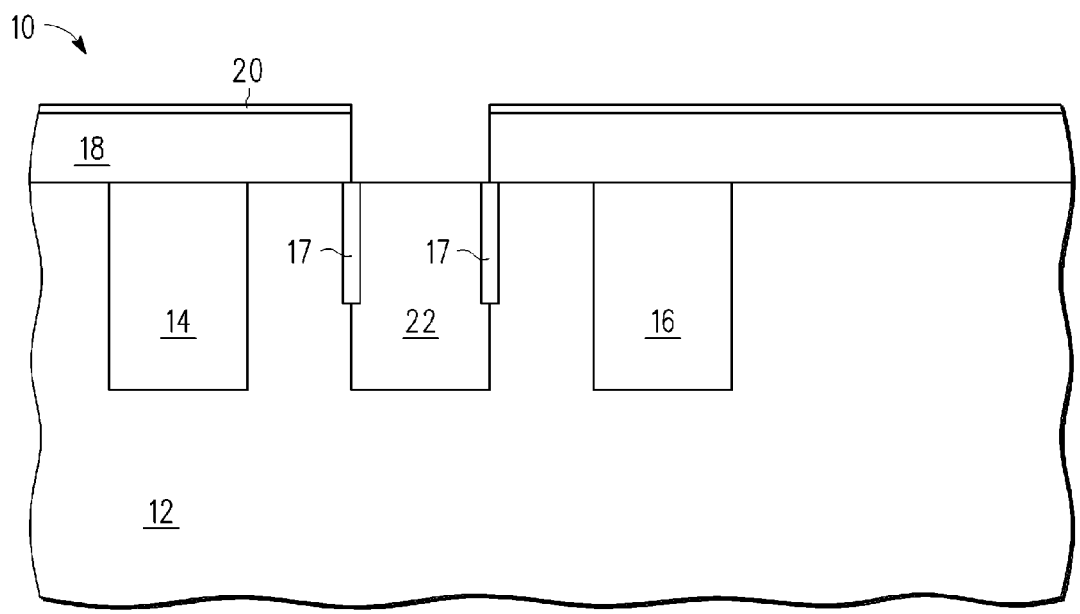
FIG. 4 is a cross section of the semiconductor device of FIG. 3 after subsequent processing.

Shown in FIG. 4 is semiconductor device 10 after performing a patterned etch of nitrogen-rich oxide layer 20 and oxide layer 18 over region 22. The etch is aligned to isolation 17 so alignment is easily achieved.

Figure 5:
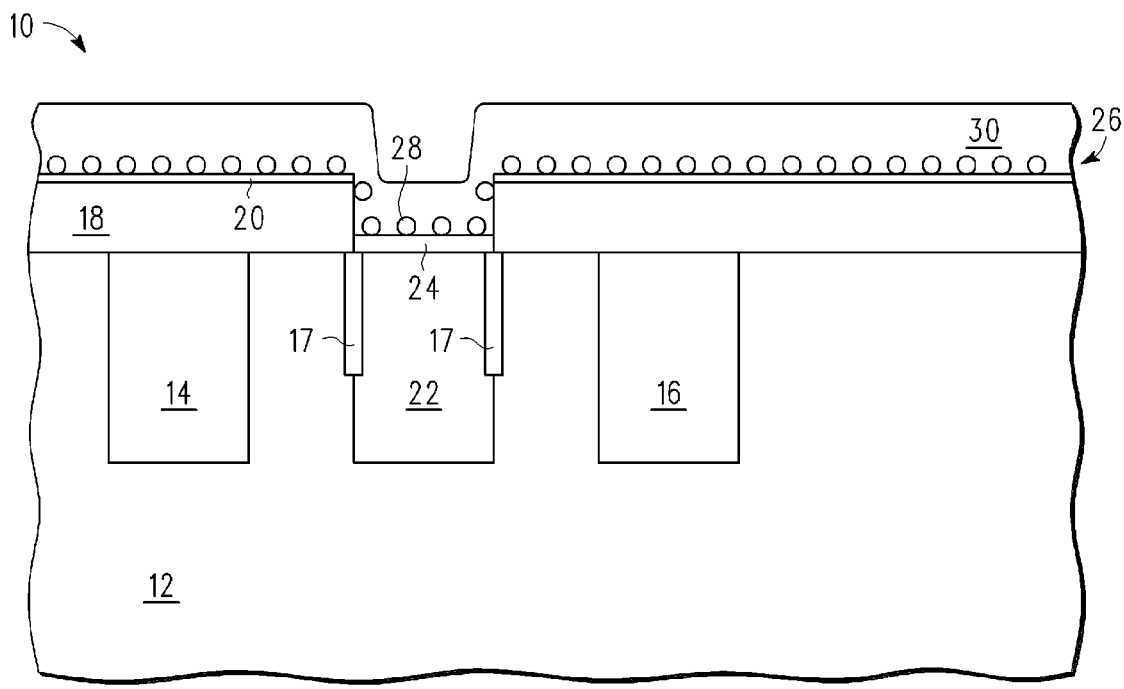
FIG. 5 is a cross section of the semiconductor device of FIG. 4 after subsequent processing.

Shown in FIG. 5 is semiconductor device 10 after forming a gate dielectric 24 on region 22 by growing oxide and forming a charge storage layer comprised of a plurality of nanocrystals 26 on gate dielectric 24 and over nitrogen-rich oxide layer 20 and an oxide layer 30 over and around plurality of nanocrystals 26. Oxide layer 30 is a deposited oxide, preferably what is commonly called high temperature oxide (HTO). Oxide layer 30 is about 150 Angstroms thick. Nanocrystal 28 is a nanocrystal of plurality of nanocrystals 26 that is over region 22 and on gate dielectric 24. Because oxide layer 30 is deposited, there is not very much free oxygen to react with nanocrystals 26 during the deposition of oxide layer 30.

Figure 6:
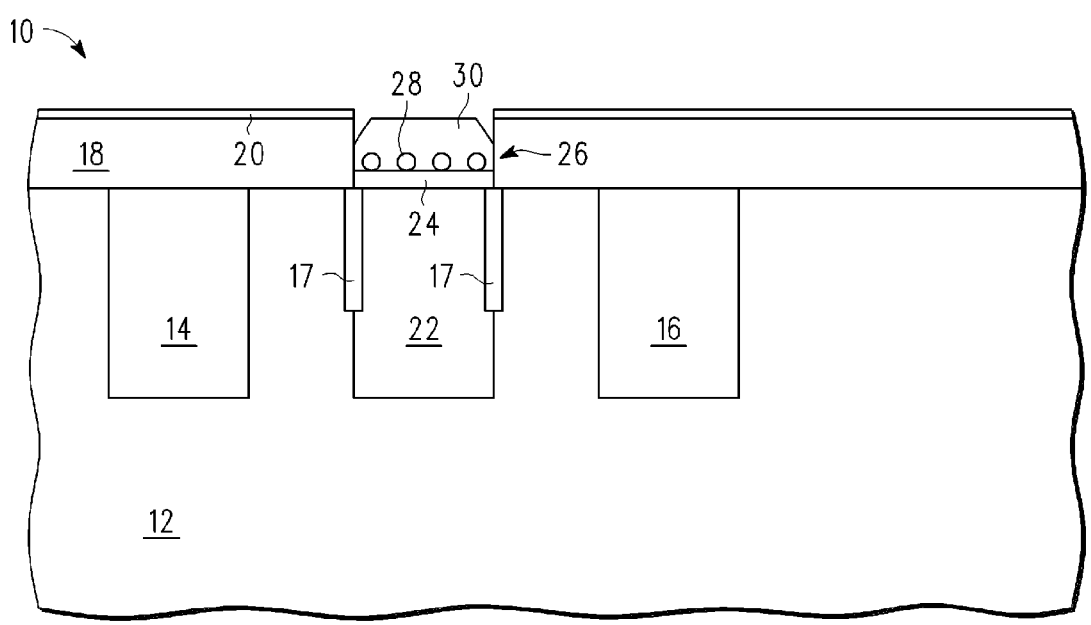
FIG. 6 is a cross section of the semiconductor device of FIG. 5 after subsequent processing.

Shown in FIG. 6 is semiconductor device 10 after etching the charge storage layer by etching oxide layer 30 and nanocrystals 26 to leave oxide layer 30 and nanocrystals 26 over gate dielectric 24. This etch is preferably a wet etch of hydrofluoric acid. This is very effective for etching oxide and highly selective to nitride. Thus, the etch removes oxide layer 30 and nanocrystals 26 and except over region 22 which is masked off during this patterned etch. Nitrogen-rich oxide layer 20 thus protects oxide layer 18 over region 14. If nitrogen-rich oxide layer 20 were not present, the etchant that removes oxide layer 30 would also necessarily etch into layer 18 which is oxide. Not only would that make it difficult to control the thickness of oxide layer 18 over region 14, where oxide layer 18 will be the gate dielectric, but it also would make the surface rough, adversely impacting transistor performance such as leakage.

Figure 7:
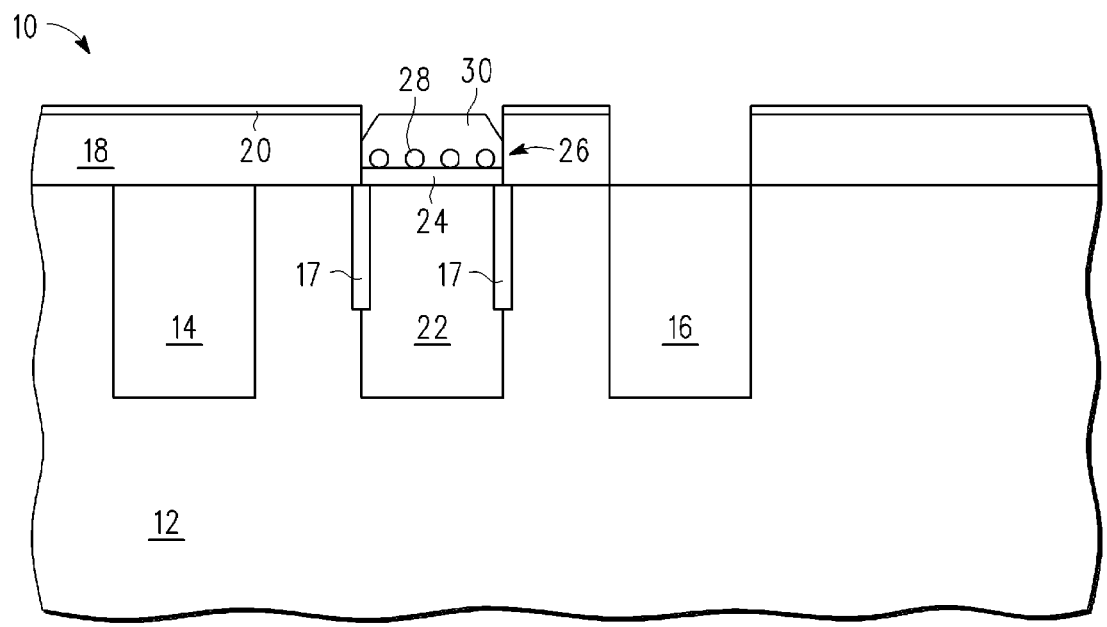
FIG. 7 is a cross section of the semiconductor device of FIG. 6 after subsequent processing.

Shown in FIG. 7 is semiconductor device 10 after performing a patterned etch over region 16 to expose region 16.

Figure 8:
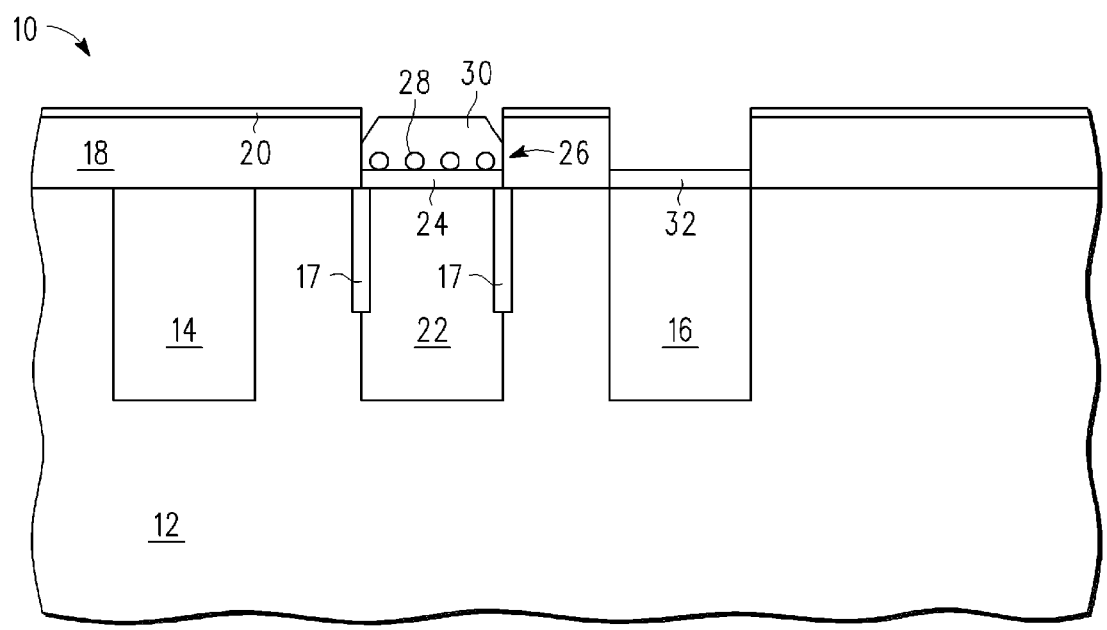
FIG. 8 is a cross section of the semiconductor device of FIG. 7 after subsequent processing.

Shown in FIG. 8 is semiconductor device 10 after forming gate dielectric 32 by growing oxide on region 16. Gate dielectric 32 is preferably about 50 Angstroms thick.

Figure 9:
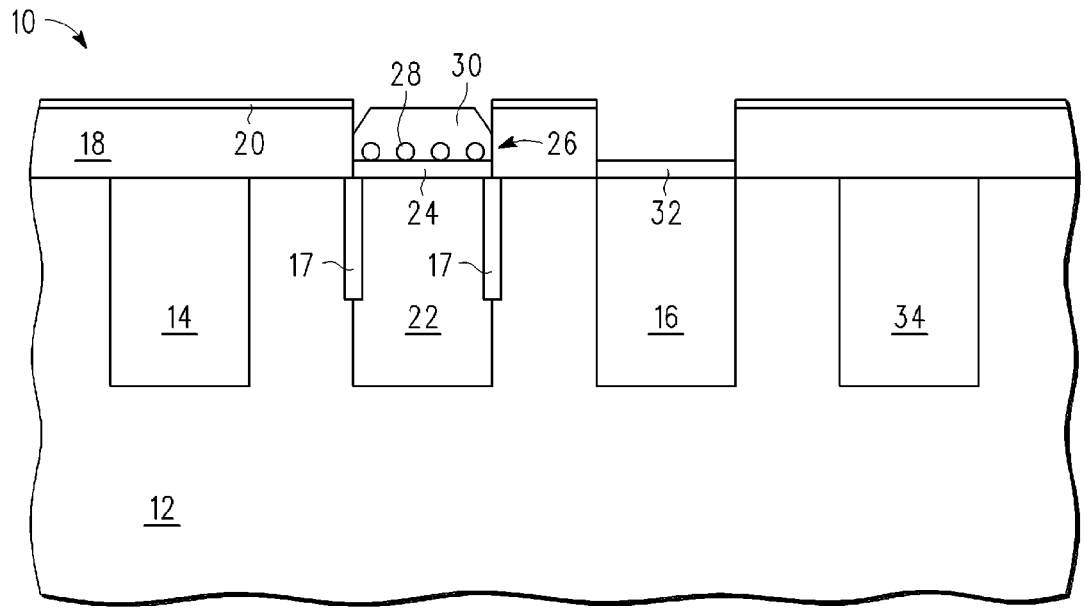
FIG. 9 is a cross section of the semiconductor device of FIG. 8 after subsequent processing.

Shown in FIG. 9 is a semiconductor device 10 after forming region 34 in substrate 12 by a patterned implant. Region 34 functions as a well for forming logic transistors. These transistors are for the fast logic circuits of an integrated circuit having thinner gate dielectrics than the I/O transistors have. Region 34 preferably has isolation, not shown, similar to isolation 17 around it.

Figure 10:
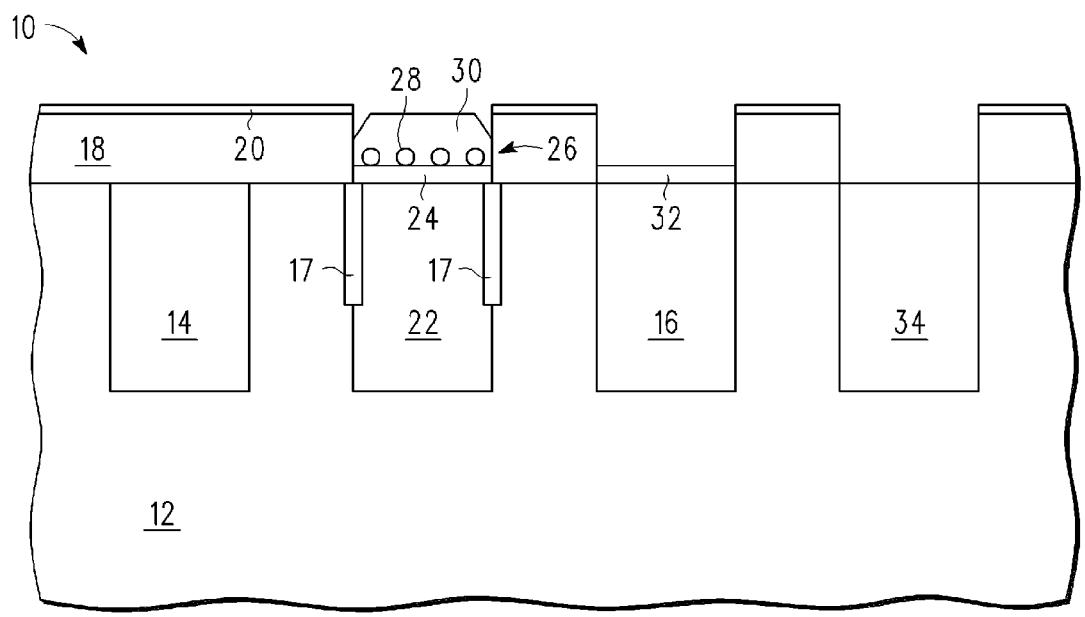
FIG. 10 is a cross section of the semiconductor device of FIG. 9 after subsequent processing.

Shown in FIG. 10 is semiconductor device 10 after performing a patterned etch over region 34 to expose region 34.

Figure 11:
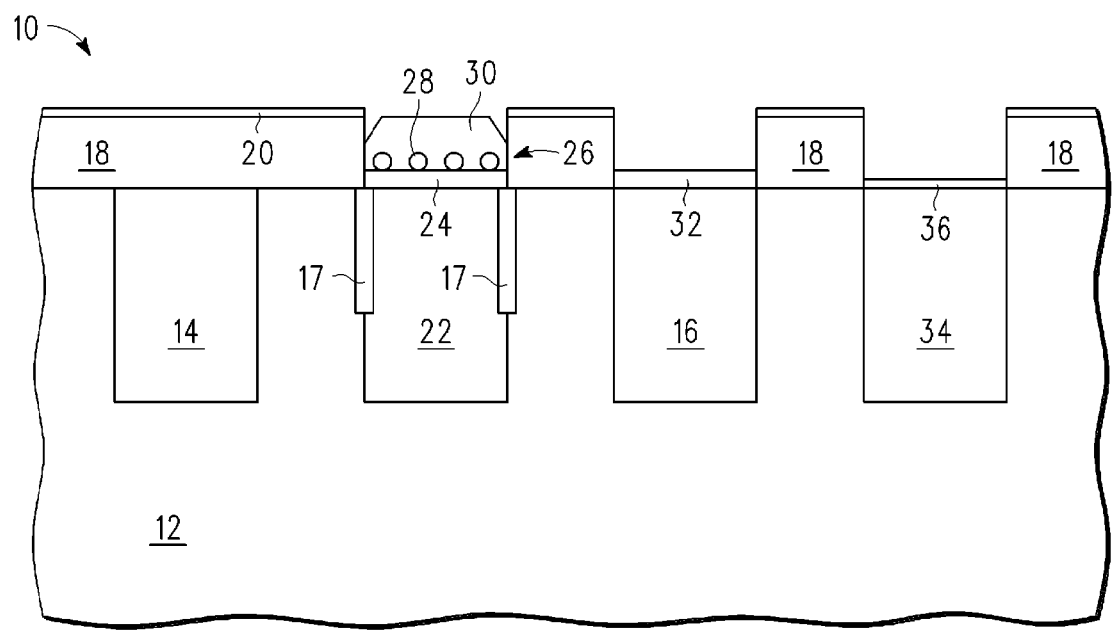
FIG. 11 is a cross section of the semiconductor device of FIG. 10 after subsequent processing.

Shown in FIG. 11 is semiconductor device 10 after forming gate dielectric 36 by growing oxide on region 34. Gate dielectric 36 is preferably about 20 Angstroms thick.

Figure 12:
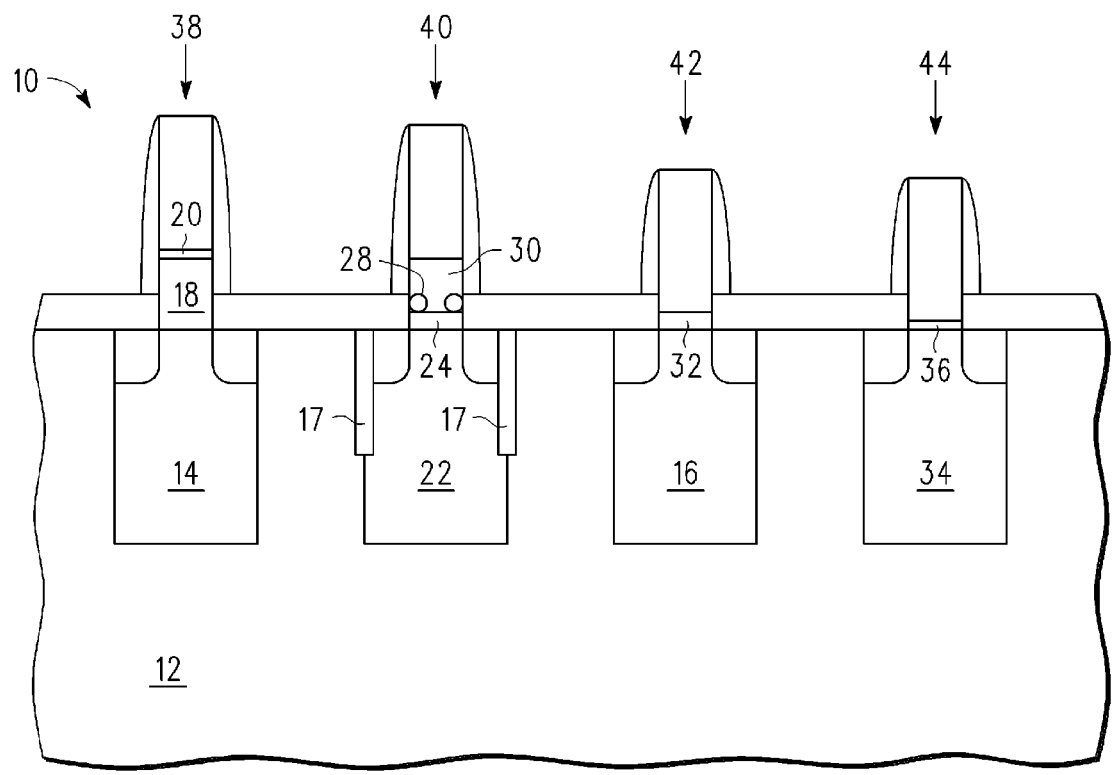
FIG. 12 is a cross section of the semiconductor device of FIG. 11 after subsequent processing.

Shown in FIG. 12 is semiconductor device 10 after forming a transistor 38, which is a high voltage transistor, over and in region 14; a transistor 40, which is an NVM transistor, over and in region 22; transistor 42, which is an I/O transistor, over and in region 16; and a transistor 44, which is a logic transistor, over an in region 34. Thus the high voltage transistor has oxide layer 18 and nitrogen-rich oxide layer 20 as its gate dielectric. The NVM transistor has a gate dielectric of oxide layer 24 and a storage layer of oxide layer 30 over and around nanocrystals such as nanocrystal 28. The I/O transistor has oxide layer 32 as its gate dielectric. The logic transistor has oxide layer 36 as its gate dielectric.

Thus, it is seen that there is a benefit of having a nitrogen-rich oxide layer 20 to act as an etch stop in order to protect the gate dielectric of the high voltage transistor. Using DPN, the nitrogen-rich oxide layer can be made both thin so as to have minimal affect on transistor characteristics and sufficiently uniform to protect the gate dielectric. The formation of the NVM gate dielectric after formation of the thick grown gate dielectric of the high voltage transistor avoids the nanocrystals and NVM gate dielectric being subjected to oxygen during that relatively long oxide growth at high temperature. The shorter oxide growths for the I/O and logic transistors are performed after the removal of the nanocrystals so there is reduced negative impact by the oxide growth on the NVM gate dielectric and nanocrystals and the gate dielectrics for the I/O and logic transistors are not subjected to the etch that removes the charge storage layer that includes the nanocrystals.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

In one view a semiconductor device is made on a semiconductor substrate. A first insulating layer is formed on the semiconductor substrate for use as a gate dielectric for a high voltage transistor in a first region of the semiconductor substrate. After the first insulating layer is formed, a second insulating layer is formed on the semiconductor substrate for use as a gate dielectric for a non-volatile memory transistor in a second region of the substrate. After the second insulating layer is formed, a third insulating layer is formed on the semiconductor substrate for use as a gate dielectric for a logic transistor in a third region of the substrate. Further after the step of forming the second insulating layer, the method may form nanocrystals over the semiconductor substrate. Further the method may include forming a fourth insulating layer over the first insulating layer prior to the step of forming the second insulating layer and removing the nanocrystals over the first region and the third region prior to the step of forming the third insulating layer. Further the method may include removing the first and fourth insulating layer from over the second region prior to the step of forming the second insulating layer. Further the method include removing the first and fourth insulating layer from over the third region after the step of removing the first and fourth layer from over the second region and prior to the step of forming the third insulating layer. As an alternative the method may further be characterized by the step of forming the fourth insulating layer comprising performing a step of decoupled plasma nitridation on the first layer. In addition the method may be further characterized by the step of forming the fourth insulating layer being further characterized by the fourth insulating layer comprising nitrogen-rich oxide. Yet further the method may be characterized by the step of forming the fourth insulating layer being further characterized by the fourth insulating layer not exceeding 10 Angstroms in thickness. In addition the method may be further characterized by the step of forming the fourth insulating layer being further characterized by the fourth insulating layer having a nitrogen concentration not exceeding 10 atomic percent. Yet further the method may be further characterized by the step of removing the nanocrystals comprising performing a wet etch using hydrofluoric acid. In addition the method may be further characterized by the step of forming the first insulating layer comprising growing oxide on the semiconductor substrate. Additionally, in one aspect the method may further comprise forming a fifth insulating layer, after the step of forming the second insulating layer, on the semiconductor substrate for use as a gate dielectric for an I/O transistor.

In another view, there is a method of making a semiconductor device on a semiconductor substrate. A first oxide layer is grown on the semiconductor substrate. Plasma nitridation is performed on the first oxide layer to form a nitrogen-rich oxide layer on the first oxide layer. The first oxide layer and the nitrogen-rich layer are selectively removed to leave the first oxide layer and the nitrogen-rich oxide layer over a first region of the substrate and remove the first oxide layer and the nitrogen-rich oxide layer from over a second region of the substrate. A second oxide layer is grown over the second region. A nanocrystal layer is formed over the semiconductor substrate after the step of growing the second oxide layer. The nanocrystal layer is removed from over the first region and a third region of the substrate. After the step of removing the nanocrystal layer, selectively removing the first oxide layer and the nitrogen-rich oxide layer to leave the first oxide layer and the nitrogen-rich oxide layer over the first region of the substrate and remove the first oxide layer and the nitrogen-rich oxide layer from over the third region of the substrate. A third oxide layer is grown over the third region. A first transistor of a first type is formed in and over the first region using the first oxide layer and nitrogen-rich oxide layer as a gate dielectric of the first transistor. A second transistor of a second type is formed in and over the second region using the second oxide layer as a gate dielectric of the second transistor. A third transistor of a third type is formed in and over the third region using the third oxide layer as a gate dielectric of the third transistor. The method may be further characterized by the step of growing the first oxide layer being further characterized by the first oxide layer having a first thickness, the step of growing the second oxide layer being further characterized by the second oxide layer having a second thickness less than the first thickness, and the step of growing the third oxide layer being further characterized by the third oxide layer having a third thickness less than the second thickness. Also the method may be further characterized by the step of forming the first transistor being further characterized by the first transistor being a high voltage transistor, the step of forming the second transistor is further characterized by the second transistor being a non-volatile memory transistor, and the step of forming the third transistor is further characterized by the third transistor being a logic transistor. Also the method may be further characterized by the step of removing the nanocrystal layer further comprising removing the nanocrystal layer from over a fourth region of the substrate and the method may further comprise selectively removing, after the step of removing the nanocrystals, the first oxide layer and the nitrogen-rich oxide layer to leave the first oxide layer and the nitrogen-rich oxide layer over the first region of the substrate and remove the first oxide layer and the nitrogen-rich oxide layer from over the fourth region of the substrate, growing a fourth oxide layer over the fourth region, and forming a fourth transistor of a fourth type on and over the fourth region using the fourth oxide layer as a gate dielectric of the fourth transistor. Also the method may be further characterized by the step of performing decoupled plasma nitridation being further characterized by the nitrogen-rich oxide layer being not more than 10 Angstroms in thickness. Also the method may be further characterized by the step of performing decoupled plasma nitridation being further characterized by the nitrogen-rich oxide layer having a nitrogen concentration not exceeding 10 atomic percent In a further view, a semiconductor device comprises a high voltage transistor, a non-volatile memory transistor; an a logic transistor. The high voltage transistor has a gate dielectric comprising an oxide layer and a nitrogen-rich oxide layer, wherein the nitrogen-rich oxide layer is not more than 10 Angstroms thick and has a concentration of nitrogen not in excess of 10 atomic percent; wherein the oxide layer has a first thickness. The non-volatile memory transistor has a gate dielectric of a second thickness less than the first thickness. The logic transistor has a gate dielectric of a third thickness less than the second thickness. Further the semiconductor device may further comprise an I/O transistor having a gate dielectric of a fourth thickness greater than the third thickness and less than the first thickness.

The invention claimed is:

1. A method of making a semiconductor device on a semiconductor substrate, comprising:
    forming a first oxide layer on the semiconductor substrate for use as a gate dielectric for a high voltage transistor in a first region of the semiconductor substrate;
    performing decoupled plasma nitridation to the first oxide layer to form a nitrogen-rich oxide on a top surface of the oxide layer, wherein the nitrogen-rich oxide layer has a nitrogen concentration of not more than 10 atomic percent;
    forming a first well region in a portion of the substrate;
    removing a portion of the nitrogen-rich oxide layer and a portion of the first oxide layer over the first well;
    forming a first insulating layer, after the step of forming the oxide layer, on the well for use as a gate dielectric for a non-volatile memory transistor in and over the well;
    forming a charge storage layer including nanocrystals over the nitrogen-rich oxide layer and over the first insulating layer; and
    removing the charge storage layer including the nanocrystals over the nitrogen-rich oxide layer and adjacent to the first well using an etchant that is selective between the charge storage layer including the nanocrystals and the nitrogen-rich oxide layer so that the nitrogen-rich oxide layer functions as an etch stop layer during overetching of the charge storage layer including the nanocrystals.

2. The method of claim 1, further comprising:
    forming a gate over the charge storage layer over the first insulating layer.

3. The method of claim 2, further comprising:
    forming a gate on the nitrogen-rich oxide layer over the first region.

4. The method of claim 3, further comprising
    forming a well in a second portion of the substrate for use in forming a logic transistor;
    removing a portion of the nitrogen-rich oxide layer and the first oxide layer over the second portion of the substrate;
    forming a gate dielectric for the logic transistor on the second portion of the substrate; and
    forming a gate on the gate dielectric.

5. The method of claim 1, wherein the step of removing the charge storage layer including nanocrystals comprises performing a wet etch using hydrofluoric acid.

* * * * *